April 4, 1961 J. S. WALKER 2,978,594

PULSE AMPLIFIERS

Filed Nov. 29, 1956

INVENTOR
JOHN SIDDALL WALKER
BY Howe and Nydick
ATTORNEYS

United States Patent Office 2,978,594

Patented Apr. 4, 1961

2,978,594

PULSE AMPLIFIERS

John Siddall Walker, Stevenage, England, assignor to International Computers and Tabulators Limited, London, England, a British company Filed Nov. 29, 1956, Ser. No. 625,177

Claims priority, application Great Britain Feb. 3, 1956

5 Claims. (Cl. 307—88.5)

This invention relates to pulse amplifying circuits which employ transistors having a current gain greater than unity.

It is well known that the current gain, that is, the ratio of the change of collector current produced by a given change of emitter current, of a transistor depends both upon the type of construction and upon the operating conditions. In general, point contact types normally have a current gain greater than unity, whilst junction types have a current gain less than unity. However, junction types can give current gains exceeding unity, for example, when the hook-collector construction is employed.

It is an object of the present invention to provide an improved pulse amplifying circuit using a transistor, which produces an output pulse a predetermined time after the occurrence of an input pulse.

It is a further object of the invention to provide dynamic trigger circuit, that is, a circuit in which a single input pulse can produce a train of output pulses.

According to one aspect of the invention, a pulse amplifying circuit, employing a transistor with a current gain exceeding unity, has means for applying an input pulse to the emitter of the transistor to produce a regenerative increase in collector current of the transistor, an inductor connected to the base of the transistor and adapted to initiate a regenerative decrease in collector current, a capacitative load circuit connected to the collector, and means for applying a clock pulse to the collector load circuit to control the timing of a pulse delivered to an output load.

According to another aspect of the invention a dynamic trigger circuit, employing a transistor with a current gain exceeding unity, has means for applying an input pulse to the emitter of the transistor to produce a regenerative increase in the collector current of the transistor, an inductor connected to the base of the transistor and adapted to initiate a regenerative decrease in collector current, a capacitative load circuit connected to the collector, means for applying a regular succession of clock pulses to the collector load circuit to control the timing of output pulses from said circuit and means for applying the output pulses to the emitter of the collector, whereby a single input pulse is adapted to produce a succession of output pulses.

The invention will now be described, by way of example, with reference to the accompanying drawing, in which.

Figure 1:
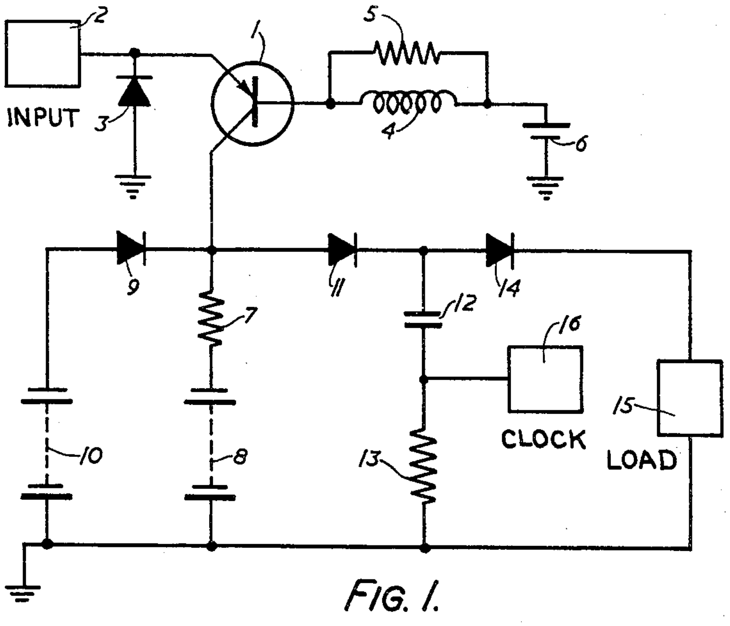
Figure 1 is a circuit diagram of a point contact transistor pulse amplifier.

Positive input pulses are applied directly to the emitter of a transistor 1 (Figure 1), by an input pulse source 2. A diode 3 prevents the emitter falling below ground potential.

The base of the transistor is connected through an inductor 4, which has a damping resistor 5 connected in parallel, to the positive terminal of a 1.5 volt battery 6. The negative terminal of the battery is connected to ground.

The collector is connected through a load resistor 7 to the negative terminal of a 24 volt battery 8, and through a diode 9 to the negative terminal of a 12 volt battery 10. The positive terminals of the batteries 8 and 10 are connected to ground. This arrangement holds the collector at approximately −12 volts when the circuit is quiescent, and the transistor is "cut off."

When the applied positive input pulse rises above 1½ volts the emitter is positive with respect to the base and hence emitter current flows. Since the current gain is greater than unity, the resultant collector current which flows is larger than the emitter current. The collector current is the sum of emitter and base currents, and since the impedance of the base circuit is high the excess of collector current over emitter current must give rise to a further increase in emitter current. This results in a regenerative increase in emitter and collector currents until the transistor reaches the saturated condition. Due to the low impedance between collector, base and emitter when the transistor is conducting heavily, the emitter and base are pulled negative by the collector and the emitter drops to ground potential, where it is caught by the diode 3. The base also drops by a similar amount. This drop appears across the inductor 4 and causes a rise in base current, the rate of rise depending upon the value of the inductance. Since the maximum collector current is defined by the battery 8 and resistor 7, and the base current is the collector current less the emitter current, the rise of base current must produce a drop in emitter current. This drop in emitter current tends to return the transistor to the linear portion of the characteristic, so that the effect of the inductor is to initiate a regenerative decrease in collector current and the circuit returns to the quiescent state, assuming that the input pulse has dropped below 1½ volts by this time.

The collector voltage rises to approximately −2 volts when the transistor is saturated. The collector is connected through a diode 11 to one side of a capacitor 12, the other side of which is connected to ground through a resistor 13. Hence, the rise in collector voltage charges the capacitor 12, which constitutes a capacitative load circuit for the transistor.

The cathode of the diode 11 is also connected to the anode of a diode 14, the cathode of which is connected to an output load 15. The cathode of the diode 14 is connected to ground through the low impedance output load 15. The anode of the diode is at approximately the same potential as the collector, i.e. minus 2 volts, so that the diode remains non-conducting.

Positive clock pulses are applied to the junction of the resistor 13 and the capacitor 12, from the source 16. A clock pulse will be present during the transistor conduction period. By choosing the correct value of inductance 4, the transistor conduction period is arranged to extend beyond the period of the positive clock pulse. Thus after the end of the clock pulse the capacitor will be charged to −2 volts by the transistor output. The diode 11 prevents the capacitor discharging appreciably when the collector voltage falls due to the cessation of the input pulse.

The next positive clock pulse will appear after the transistor output has falled to −12 volts. If the clock pulse is of 6 volts amplitude, the junction of the diodes 11 and 14 tends to rise to +4 volts. With a low load impedance 15, the diode 14 conducts when the junction is only a small amount above ground, and current flows into the load without any substantial further increase in the voltage of the junction. When the clock pulse ceases, the junction of the diodes is pulled down to approximately −6 volts, cutting off the output pulse.

If no input pulse is applied before the next clock pulse is applied, the junction of the diodes 11 and 14 is just brought up to ground by the clock pulse and no appreciable current flows through the diode 14. In practice, leakage current through the back resistance of the diode 11 tends to discharge the capacitor between clock pulses, in the absence of an input pulse. This increases the margin of safety and ensure that no output pulse is produced.

Thus the circuit produces an output pulse of known timing and duration in response to an input pulse, the timing and duration being controlled by the clock pulse.

The switching of the transistor back to the quiescent state is controlled by the inductance in the base circuit, so that the upper limit of frequency response of the amplifier is less dependent upon the limitations normally set by hole storage. The standing current through the clamping diode 9 is comparatively large in relation to the collector current, so that variations in this latter current are largely swamped. This makes the circuit tolerant of differences of current between individual transistors, or of the same transistor operated at different temperatures.

The circuit described above operates in the manner of a normal pulse amplifier, in that a single pulse is delivered to the load 15 for each input pulse from the source 2, even though the pulse to the load is timed by the clock pulses from the source 16. The clock pulses normally would occur in regular succession and would be synchronised with the input pulses in the use of the amplifier in a computer, for example, in which the clock pulses at the basic operating frequency of the machine. It will be apparent, however, that the essential requirement is only that the clock pulse source must supply a pulse after each input pulse and that the delay between each input pulse and the corresponding clock pulse must be such that the charge on the capacitor 12 has not leaked away appreciably before the clock pulse occurs. Hence, provided that this requirement is fulfilled, the input pulses and associated clock pulses may have an irregular timing.

Figure 2:
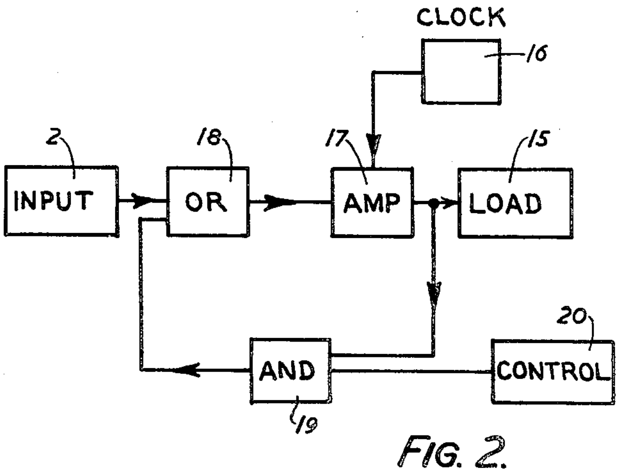
Figure 2 is a schematic diagram of a dynamic trigger circuit employing a pulse amplifier.

The pulse amplifier, when operated with regularly recurring clock pulses, is particularly suitable for use as a dynamic trigger circuit, that is, a device which, on receipt of a single input pulse, starts to supply a succession of pulses to the load and continues to supply pulses until a further signal returns the circuit to the original state. One way in which a dynamic trigger may be constructed is shown in block schematic form in Figure 2.

A pulse amplifier 17, similar to that already described, receives pulses from the input source 2 through an OR gate 18. The output of the amplifier is fed to the load 15, as before, and also to the input of an AND gate 19. The gate 19 also receives signals from a control source 20, and the output of the gate is applied to the OR gate 18.

A pulse from the input source 2 will pass through the OR gate 18 to the amplifier 17. This will produce an output pulse in the load 15, under control of a clock pulse from the source 16. If the control source 20 is holding the gate 19 open, then the output pulse will also pass through this gate and the gate 18 back to the input of the amplifier 17. This will produce a second output pulse which will be passed by the two gates to generate a third pulse, and so on. Thus, a regular succession of pulses is produced in the load 15 as a result of the single pulse from the source 2. The generation of pulses will continue until the gate 19 is closed by the control source 20. This will prevent an output pulse being fed back to the input, so that the next clock pulse will fail to produce an output pulse and the circuit has been returned to the original state.

The gates 18 and 19 may consist of diodes arranged in a known manner. The purpose of the gate 18 is merely to provide isolation between the input source and the gate 19 and it may be unnecessary if the relative impedances are such that interaction is inherently low.

The AND gate 19 allows the trigger to be stopped at one clock pulse time and re-started by another input pulse at the next pulse time, if this is desired. The output of the amplifier may be directly connected back to the input, and the output pulses stopped by cutting off the supply of clock pulses from the source 16. Thus, the last output pulse will cause charging of the capacitor 12, but no clock pulse will occur. The circuit cannot be operated again until the charge on the capacitor has leaked away sufficiently for an applied clock pulse not to produce an output pulse. Alternatively, a resetting pulse may be applied to the junction of the diodes 11 and 14 to forcibly discharge the capacitor.

The voltage values referred to in the description apply to a particular embodiment employing a type TP1 transistor, with the resistor 7 and the capacitor 12 having the values 2200 ohms and 470 pf., respectively. It will be appreciated that the optimum values depend upon the particular type of transistor which is employed.

I claim:

1. A pulse amplifying circuit comprising a transistor with a current gain exceeding unity, said transistor having an emitter, a collector and a base, means to apply operating potentials to the emitter, the collector and the base to bias the transistor to be normally non-conducting, means operative to apply an input pulse to the emitter of the transistor to overcome said bias and to produce a regenerative increase in the collector current of the transistor, an inductor connected to the base of the transistor and operative to initiate a regenerative decrease in the collector current, a load resistor connected to the collector, a capacitor and a further resistor connected in a first series circuit, a first diode and an output load connected in a second series circuit, the two series circuits being connected in parallel, the said further resistor being connected to the output load and the capacitor being connected to the first diode, the first diode being poled to permit the passage of current from the capacitor to the output load, a second diode connected between the collector of the transistor and the junction of the first diode and the capacitor, the second diode being poled to permit the capacitor to be charged when the transistor conducts and a source of clock pulses operative to apply clock pulses to the junction of the capacitor and the said further resistor to cause said capacitor to discharge through the first diode and the output load.

2. A pulse amplifying circuit according to claim 1, in which the operating potential applying means includes a source of biassing potential connected in series with a third diode to the junction of the collector of the transistor and the collector load resistor.

3. A pulse amplifying circuit according to claim 2, in which the potential applying means also includes a source of electrical current connected at one side to the collector load resistor to supply the collector current, the other side of the current source being connected in common to that side of the source of biassing potential remote from the said third diode, to the junction of the said further resistor and the output load, to the emitter of the transistor through a fourth diode, and to a second source of current in series with the inductor in the base circuit of the transistor.

4. A pulse amplifying circuit according to claim 1, including a source of input signals, a two-input OR gate, signals from the input signal source being applied to the first input of the OR gate, output signals from the OR gate being applied as input pulses to the emitter of the transistor, control means and a two-input AND gate, the first input of the AND gate being connected to the junction of the said first diode and the output load and the second input of the AND gate being connected to the control means, the output of the AND gate being connected to the second input of the OR gate, whereby the AND gate is conditioned in response to a signal from the control means to pass a signal delivered to the output load back to the emitter of the transistor to produce a succession of output pulses in synchronism with the clock pulses in response to a single signal from the input signal source.

5. A dynamic trigger circuit comprising a source of pulse input signals, a two-input OR gate, pulse signals from said source being applied to a first input of said OR gate, a transistor with a current gain exceeding unity, said transistor having an emitter, a collector and a base, means to apply operating potentials to the emitter, the collector and the base to bias the transistor to be normally non-conducting, means operative to apply an output signal from said OR gate to the emitter of the transistor to overcome said bias and to produce a regenerative increase in the collector current of the transistor, an inductor connected to the base of the transistor and operative to initiate a regenerative decrease in the collector current, a load resistor connected to the collector, a capacitor and a further resistor connected in a first series circuit, a first diode and an output load connected in a second series circuit, the two series circuits being connected in parallel, the said further resistor being connected to the output load and the capacitor being connected to the first diode, the first diode being poled to permit the passage of current from the capacitor to the output load, a second diode connected between the collector of the transistor and the junction of the first diode and the capacitor, the second diode being poled to permit the capacitor to be charged when the transistor conducts, a source of clock pulses operative to apply clock pulses to the junction of the capacitor and said further resistor to cause said capacitor to discharge through the first diode and the output load, so that a pulse applied to the emitter of said transistor cause a pulse to be applied to said output load, said pulse applied to said output load having its duration defined by a clock pulse and being drawn from said capacitor, control means and a two-input AND gate, a first input to said AND gate being connected to receive a pulse when a pulse is applied to said output load and a second input to said AND gate being connected to said control means, and means connecting the output of said AND gate to a second input to said OR gate, whereby said AND gate may be conditioned in response to a signal from said control means to pass a pulse signal applied to said output load back to the emitter, so that a succession of output pulses each defined by a clock pulse may be produced in response to a single signal from said input source.

References Cited in the file of this patent

UNITED STATES PATENTS

| | | |
|---|---|---|
| 2,666,139 | Endres | Jan. 12, 1954 |
| 2,683,809 | Fromm | July 13, 1954 |
| 2,691,074 | Eberhard | Oct. 5, 1954 |
| 2,748,269 | Slutz | May 29, 1956 |
| 2,752,530 | Aigrain | June 26, 1956 |
| 2,831,985 | Eckert | Apr. 22, 1958 |
| 2,835,828 | Vogelsong | May 20, 1958 |
| 2,888,579 | Wanlass | May 26, 1959 |